US012000899B2

(12) United States Patent
Matsuda et al.

(10) Patent No.: US 12,000,899 B2
(45) Date of Patent: Jun. 4, 2024

(54) VOLTAGE MEASUREMENT CIRCUIT AND ENERGY STORAGE APPARATUS

(71) Applicant: GS Yuasa International Ltd., Kyoto (JP)

(72) Inventors: Yuki Matsuda, Kyoto (JP); Masakatsu Fujimatsu, Kyoto (JP)

(73) Assignee: GS YUASA INTERNATIONAL LTD., Kyoto (JP)

( * ) Notice: Subject to any disclaimer, the term of this patent is extended or adjusted under 35 U.S.C. 154(b) by 243 days.

(21) Appl. No.: 17/611,818

(22) PCT Filed: May 25, 2020

(86) PCT No.: PCT/JP2020/020491
§ 371 (c)(1),
(2) Date: Nov. 16, 2021

(87) PCT Pub. No.: WO2020/241548
PCT Pub. Date: Dec. 3, 2020

(65) Prior Publication Data
US 2022/0244316 A1    Aug. 4, 2022

(30) Foreign Application Priority Data

May 31, 2019    (JP) ................................ 2019-102224

(51) Int. Cl.
*G01R 31/3835* (2019.01)
*G01R 31/396* (2019.01)
*H01M 10/48* (2006.01)

(52) U.S. Cl.
CPC ....... *G01R 31/3835* (2019.01); *G01R 31/396* (2019.01); *H01M 10/48* (2013.01); *H01M 10/482* (2013.01); *H01M 2220/20* (2013.01)

(58) Field of Classification Search
None
See application file for complete search history.

(56) References Cited

U.S. PATENT DOCUMENTS 6,104,164 A    8/2000 Iino et al.
2005/0007068 A1    1/2005 Johnson et al.
(Continued)

FOREIGN PATENT DOCUMENTS

JP    2000-195566 A    7/2000
JP    2000-199771 A    7/2000
(Continued)

OTHER PUBLICATIONS

International Search Report (ISR) (PCT Form PCT/ISA/210), in PCT/JP2020/020491, dated Jul. 28, 2020.

*Primary Examiner* — Jas A Sanghera
(74) *Attorney, Agent, or Firm* — MCGINN I.P. LAW GROUP, PLLC (57) ABSTRACT

A voltage measurement circuit includes: voltage dividing circuits that divide voltages of energy storage devices, in respective stages connected in series; switches that cut off the currents of the voltage dividing circuits in the respective stages, and a measurement unit that measures the voltages of the energy storage devices in the respective stages based on outputs of the voltage dividing circuits in the respective stages. The voltage dividing circuits in the respective stages each have a first resistor connected to the ground and a second resistor connected to a positive electrode of the corresponding energy storage device. The switch in a predetermined-number stage among the switches in the respective stages is an N-channel field-effect transistor (FET) having a source connected to the first resistor and a drain connected to the second resistor, and the source of the FET is a voltage output terminal with respect to the measurement unit.

6 Claims, 8 Drawing Sheets

(56) References Cited

U.S. PATENT DOCUMENTS

| | | |
|---|---|---|
| 2006/0012336 A1 | 1/2006 | Fujita |
| 2010/0045299 A1* | 2/2010 | Heeringa ............ H01M 10/482 |
| | | 324/434 |
| 2017/0331161 A1 | 11/2017 | Suzuki |
| 2019/0285669 A1 | 9/2019 | Furukawa |
| 2019/0361052 A1* | 11/2019 | Endo .................... G01R 19/165 |

FOREIGN PATENT DOCUMENTS

| | | |
|---|---|---|
| JP | 2005-150079 A | 6/2005 |
| JP | 2005-207826 A | 8/2005 |
| JP | 2006-053120 A | 2/2006 |
| JP | 2010-008227 A | 1/2010 |
| JP | 2014-106054 A | 6/2014 |
| JP | 2016-223797 A | 12/2016 |
| JP | 2017-208881 A | 11/2017 |
| JP | JP WO2017/208740 A1 | 4/2019 |

* cited by examiner

VOLTAGE MEASUREMENT CIRCUIT AND ENERGY STORAGE APPARATUS

TECHNICAL FIELD

The present invention relates to a voltage measurement circuit for an energy storage device.

BACKGROUND ART

A voltage dividing circuit may be used to measure the voltage of an energy storage device. Patent Literature 1 below discloses that a switching device is provided to cut off a current of a voltage dividing circuit when a measurement is not performed.

PRIOR ART DOCUMENT

Patent Document

Patent Document 1: JP-A-2000-195566

SUMMARY OF THE INVENTION

Problems to be Solved by the Invention

The present technology solves both a problem of an overvoltage applied to a measurement unit and a problem of malfunction of a field-effect transistor (FET).

Means for Solving the Problems

A voltage measurement circuit includes: voltage dividing circuits that divide voltages of energy storage devices in respective stages connected in series; switches that cut off currents of the voltage dividing circuits in the respective stages; and a measurement unit that measures a voltage of each of the energy storage devices in the respective stages based on an output of each of the voltage dividing circuits in the respective stages. The voltage dividing circuit in each of the stages includes a first resistor connected to the ground and a second resistor connected to a positive electrode of the corresponding energy storage device. The switch in a predetermined-number stage among the switches in the respective stages is an N-channel field-effect transistor (FET) having a source connected to the first resistor and a drain connected to the second resistor, and the source of the FET is a voltage output terminal with respect to the measurement unit.

The present technology can be applied to an energy storage apparatus.

Advantages of the Invention

According to the present technology, both the problem of an overvoltage applied to the measurement unit and the problem of malfunction of the FET can be solved.

MODE FOR CARRYING OUT THE INVENTION

Figure 1:
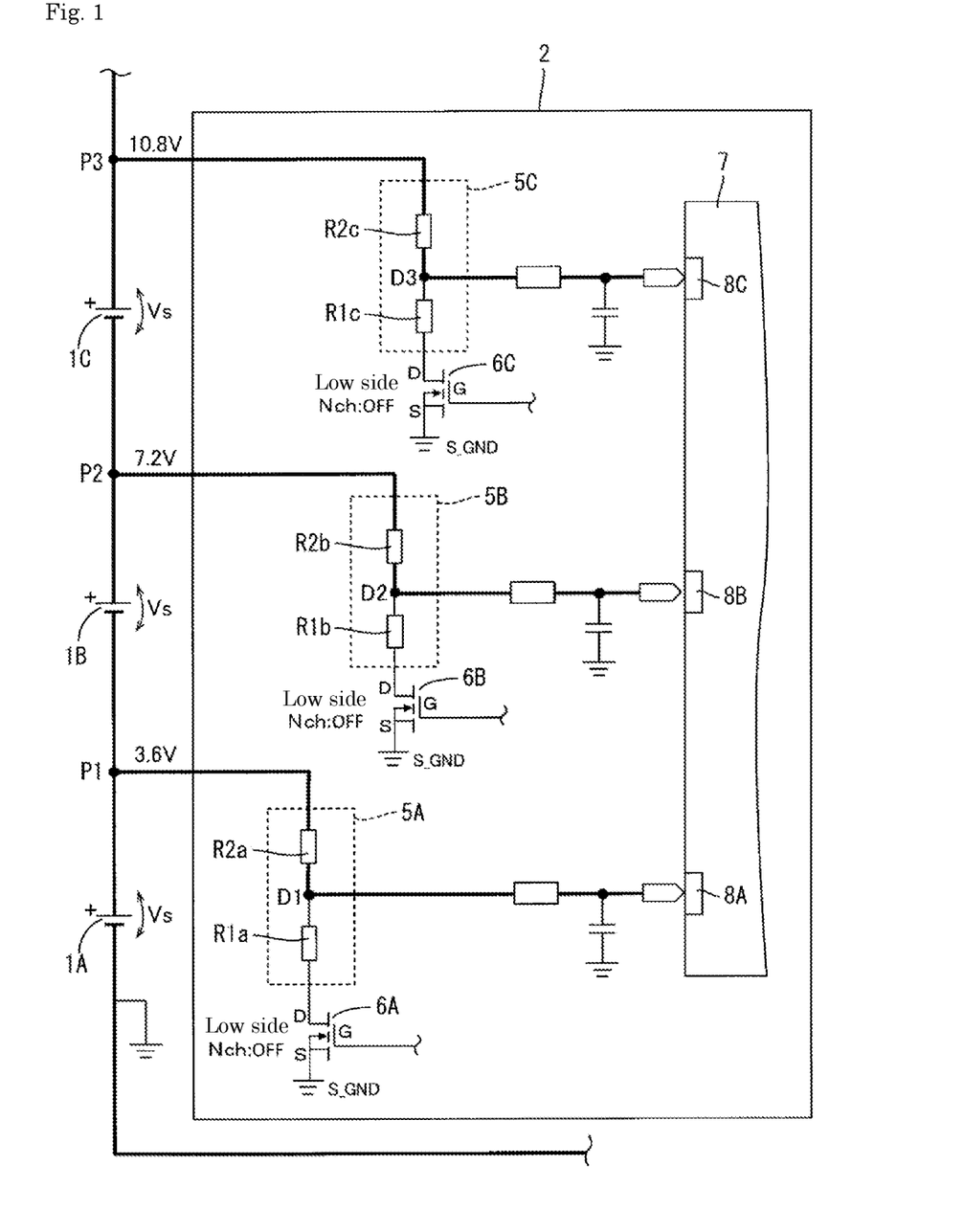
FIG. 1 is a circuit diagram of a voltage measurement circuit.

FIG. 1 is a circuit diagram of a voltage measurement circuit 2. The voltage measurement circuit 2 is for measuring voltages of three energy storage devices 1A, 1B, 1C connected in series and includes a first voltage dividing circuit 5A, a first FET 6A, a second voltage dividing circuit 5B, a second FET 6B, a third voltage dividing circuit 5C, a third FET 6C, and a measurement unit 7. The FET is a field-effect transistor.

The first voltage dividing circuit 5A is a circuit that divides the voltage of the positive electrode (the voltage of P1) of the first-stage energy storage device 1A having the lowest potential. The second voltage dividing circuit 5B is a circuit that divides the voltage of the positive electrode (the voltage of P2) of the second-stage energy storage device 1B. The third voltage dividing circuit 5C is a circuit that divides the voltage of the positive electrode (the voltage of P3) of the third-stage energy storage device 1C having the highest potential.

The first voltage dividing circuit 5A includes a first resistor R1$a$ and a second resistor R2$a$, and a connection point D1 of the two resistors is connected to a first input port 8A of the measurement unit 7 via a signal line. The second voltage dividing circuit 5B includes a first resistor R1$b$ and a second resistor R2$b$, and a connection point D2 of the two resistors is connected to a second input port 8B of the measurement unit 7 via a signal line. The third voltage dividing circuit 5C includes a first resistor R1$c$ and a second resistor R2$c$, and a connection point D3 of the two resistors is connected to a third input port 8C of the measurement unit 7 via a signal line.

The measurement unit 7 is a central processing unit (CPU) or a microprocessor unit (MPU) and detects the voltage of the positive electrode of the first-stage energy storage device 1A based on the voltage of the first input port 8A. The voltage of the positive electrode of the second-stage energy storage device 1B is detected based on the voltage of the second input port 8B. The voltage of the positive electrode of the third-stage energy storage device 1C is detected based on the voltage of the third input port 8C.

In the voltage measurement circuit 2, the N-channel first FET 6A is provided on the low side of the first voltage dividing circuit 5A. In the voltage measurement circuit 2, the N-channel second FET 6B is provided on the low side of the second voltage dividing circuit 5B. In the voltage measurement circuit 2, the N-channel third FET 6C is provided on the low side of the third voltage dividing circuit 5C. When the measurement is not performed, the first FET 6A, the second FET 6B, and the third FET 6C are turned off, so that the current of the first voltage dividing circuit 5A, the current of the second voltage dividing circuit 5B, and the current of the third voltage dividing circuit 5C can be cut off.

In a case where the FET 6 is disposed on the low side of the voltage dividing circuit 5, when the FET 6 is turned off, the measurement unit 7 is electrically connected to the positive electrode of the energy storage device 1. Thus, as shown in FIG. 1, during the current interruption (when the FET is off), the voltage of the positive electrode of the corresponding energy storage device 1 is applied to the input port 8 of the measurement unit 7.

The voltage of the positive electrode of the energy storage device 1 increases with an increase in stage number, and hence the voltage may exceed an allowable voltage at the input port 8 for measuring the energy storage device 1 of a higher order.

For example, when the allowable voltage of each of the input ports 8A to 8C is 5 V, and a cell voltage Vs of each of the energy storage devices 1A to 1C is 3.6 V, the voltage of the positive electrode of the first-stage energy storage device 1A is 3.6 V, and the voltage of the positive electrode of the second-stage energy storage device 1B is 7.2 V. Since the voltage of the positive electrode of the second-stage energy storage device 1B is higher than the allowable voltage, an overvoltage higher than the allowable value is applied to the second input port 8B when the second FET 6B is off.

The voltage of the positive electrode of the third-stage energy storage device 1C is higher than the voltage of the positive electrode of the second-stage energy storage device 1B, and thus, when the third FET 6C is turned off, an overvoltage higher than the allowable value is applied to the third input port 8C similarly to the second stage.

Figure 2:
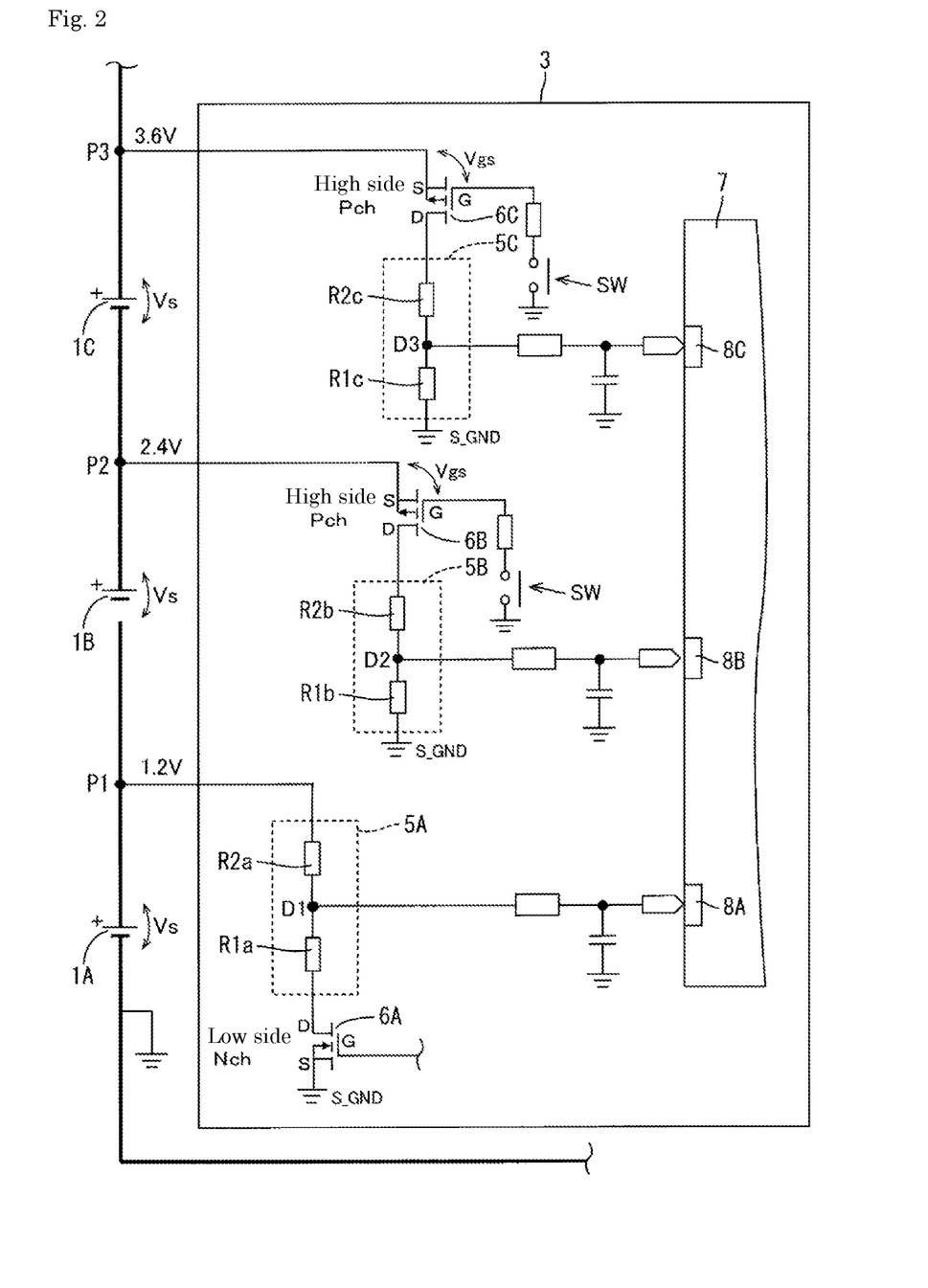
FIG. 2 is a circuit diagram of a voltage measurement circuit.

The voltage measurement circuit 3 in FIG. 2 differs from voltage measurement circuit 2 in the second FET 6B and the third FET 6C. The second FET 6B and the third FET 6C are P channels and are located on the high sides of the second voltage dividing circuit 5B and the third voltage dividing circuit 5C.

By providing the second FET 6B and the third FET 6C on the high sides, when the FET 6 is turned off, the second-stage energy storage device 1B and the third-stage energy storage device 1C can be separated from the second input port 8B and the third input port 8C, so that it is possible to prevent the application of an overvoltage to each of the second input port 8B and the third input port 8C.

However, because the P-channel FET 6 disposed on the high side of the voltage dividing circuit 5 operates with the positive electrode of the corresponding energy storage device 1 as a reference potential, when the voltage of the positive electrode of the corresponding energy storage device 1 is low, Vgs>Vth may not be satisfied even if a switch (SW) is turned on to electrically connect the gate to the ground, and the FET 6 may not be switched from off to on. That is, even when the FET 6 is turned on to measure the voltage, the FET 6 may not be switched from off, and the voltage of the positive electrode of the energy storage device 1 may not be able to be measured.

For example, when the cell voltage Vs of each of the energy storage devices 1A to 1C in the respective stages is 1.2 V, and Vth is 2.5 V, the voltage of the positive electrode of the second-stage energy storage device 1B is 2.4 V. Thus, Vgs when the SW is turned on is 2.4 V, which is smaller than Vth=2.5 V. When Vgs<Vth, the second FET 6B is not turned on, and a measurement failure occurs. Vgs is a gate-source voltage of the FET 6, and Vth is a threshold voltage (a voltage at which the FET is switched from off to on).

On the other hand, the voltage of the positive electrode of the third-stage energy storage device 1C is 3.6 V, and when the SW is turned on, and the gate is electrically connected to the ground, Vgs>Vth is satisfied, so that the third FET 6C operates normally.

As exemplified in the second-stage energy storage device 1B, when the highest voltage of the positive electrode of the energy storage device 1 is higher than the allowable voltage of the measurement unit 7, and the lowest voltage of the positive electrode is lower than a threshold voltage Vth of the FET, both the problem of an overvoltage and the problem of malfunction of the FET cannot be solved even when the FET 6 is disposed on either the low side or the high side of the voltage dividing circuit 5.

That is, when the N-channel FET 6 is selected to be disposed on the low side of the voltage dividing circuit 5, the problem of an overvoltage cannot be solved, and when the P-channel FET 6 is selected to be disposed on the high side of the voltage dividing circuit 5, the problem of malfunction of the FET cannot be solved. The high side is the upstream side in the flow direction of electricity (the power supply side), and the low side is the downstream side in the flow direction of electricity (the ground side).

In addition, regardless of the magnitude relationship between the voltage of the positive electrode of the energy storage device and the allowable voltage of the measurement unit and the magnitude relationship between the voltage of the positive electrode of the energy storage device and the threshold voltage of the FET, when measures against both the overvoltage and the malfunction of the FET are taken, the reliability of the voltage measurement circuit is enhanced.

The inventors have studied whether it is possible to prevent an overvoltage applied to the measurement unit while preventing the malfunction of the FET by reviewing the channel of the FET and the positional relationship between the FET and the voltage dividing circuit.

Figure 3:
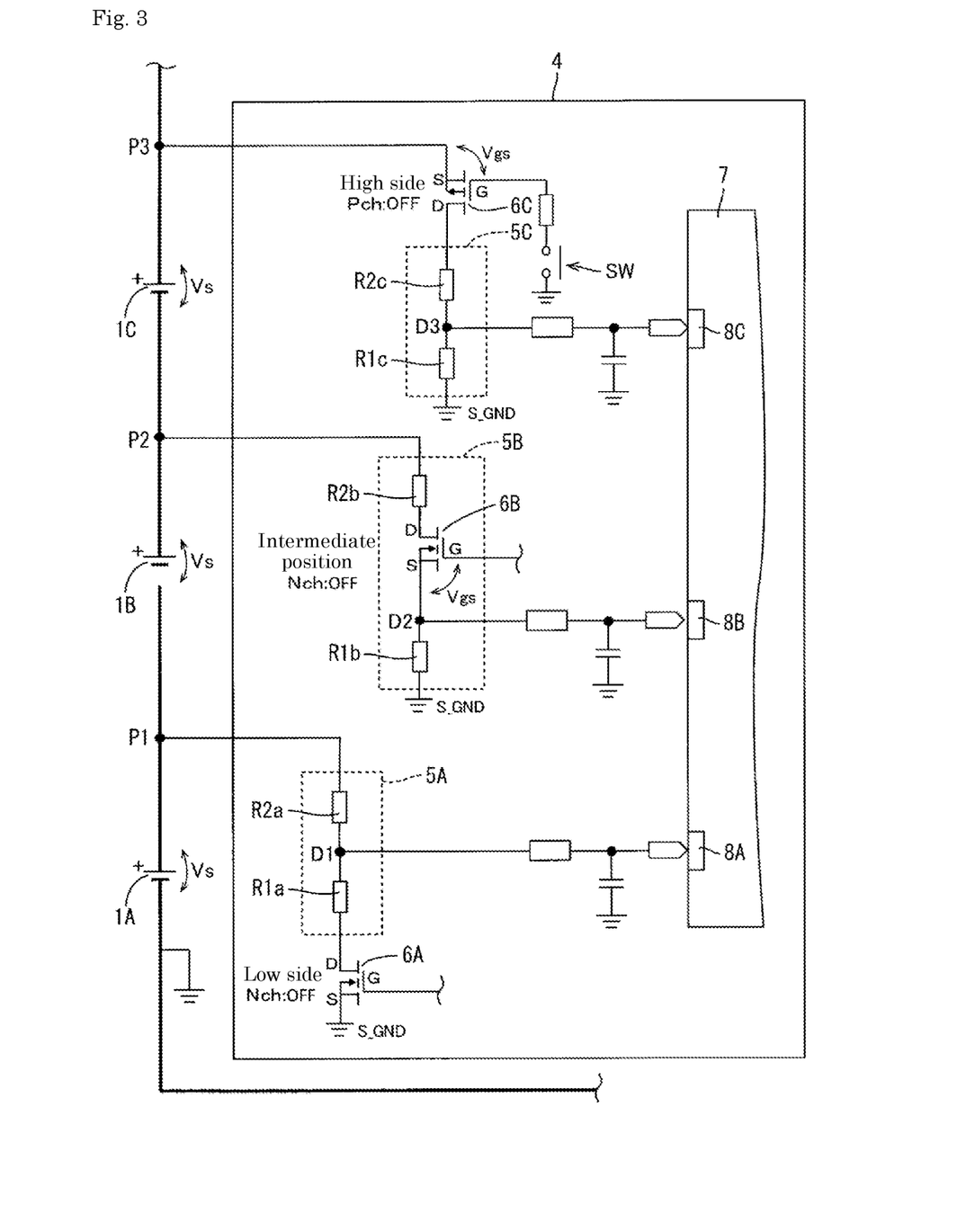
FIG. 3 is a circuit diagram of a voltage measurement circuit.

FIG. 3 is a circuit diagram of the voltage measurement circuit 4. The voltage measurement circuit 4 differs from the voltage measurement circuit 3 in FIG. 2 in that the channel of the second-stage FET 6B is changed and that the positional relationship with respect to the voltage dividing circuit 5B is changed.

The FET 6B is an N channel. The FET 6B is located between the first resistor R1$b$ and the second resistor R2$b$ of the voltage dividing circuit 5B and has a source connected to the first resistor R1$b$ and a drain connected to the second resistor R2$b$. Since the FET 6B operates based on the ground, the switching can be performed without depending on the voltage of the positive electrode (the voltage of P2) of the second-stage energy storage device 1B. Hence the malfunction of the FET 6B can be prevented.

The source of the FET 6B is connected to the second input port 8B of the measurement unit 7 via a signal line and is a voltage output terminal with respect to the measurement unit 7. When the FET 6B is off, the second input port 8B is electrically connected to the ground via the first resistor R1$b$, and hence the voltage of the positive electrode of the second-stage energy storage device 1B is not applied. As thus described, the present inventors have found that both the problem of an overvoltage and the problem of malfunction of the FET can be solved by reviewing the positional relationship between the channel of the FET 6 and the voltage dividing circuit 5.

Hereinafter, an outline of the present invention will be described.

A voltage measurement circuit includes: voltage dividing circuits that divide voltages of energy storage devices in respective stages connected in series; switches that cut off currents of the voltage dividing circuits in the respective stages; and a measurement unit that measures a voltage of each of the energy storage devices in the respective stages based on an output of each of the voltage dividing circuits in the respective stages. The voltage dividing circuit in each of the stages includes a first resistor connected to the ground and a second resistor connected to a positive electrode of the corresponding energy storage device. The switch in a predetermined-number stage among the switches in the respective stages is an N-channel field-effect transistor (FET) having a source connected to the first resistor and a drain connected to the second resistor, and the source of the FET is a voltage output terminal with respect to the measurement unit.

Since the switch in a predetermined-number stage is an N-channel FET and operates based on the ground, the switching can be performed without depending on the voltage of the positive electrode of the energy storage device. Hence the malfunction of the FET can be prevented.

The FET is located between the first resistor and the second resistor, and the source is a voltage output terminal with respect to the measurement unit. When the FET is off, the measurement unit is electrically connected to the ground via the first resistor and is not electrically connected to the positive electrode of the energy storage device. Accordingly, when the measurement is not performed, it is possible to prevent the voltage of the positive electrode of the energy storage device from being applied to the measurement unit and causing an overvoltage in the predetermined-number stage. It is possible to prevent a failure of the measurement unit and to prevent a failure in monitoring the voltage of the energy storage device.

Among the switches in the respective stages, the switch in a stage with a number higher than the number of the predetermined-number stage may be a P-channel FET located on the high side of the voltage dividing circuit. When the measurement is not performed, it is possible to prevent the voltage of the positive electrode of the energy storage device from being applied to the measurement unit and causing an overvoltage in the stage with the number higher than the number of the predetermined-number stage. It is possible to prevent a failure of the measurement unit and to prevent a failure in monitoring the voltage of the energy storage device.

Among the switches in the respective stages, the switch in a stage with a number lower than the number of the predetermined-number stage may be an N-channel FET having a source connected to the ground. Since the operation is performed based on the ground, it is possible to prevent the occurrence of malfunction of the FET in the stage with the number lower than the number of the predetermined-number stage.

The voltage measurement circuit includes: a first drive line that drives the P-channel FET; and a second drive line that drives the N-channel FET. The first drive line may be connected to the ground via a first switch, and the second drive line may be connected to a positive electrode of the energy storage device in the uppermost stage via a second switch.

When the first switch is turned on, the first drive line is electrically connected to the ground to lower the voltage of the gate, so that the P-channel FET can be switched from off to on. When the second switch is turned on, the second drive line is electrically connected to the positive electrode of the uppermost-stage energy storage device, and the voltage of the gate increases, so that the N-channel FET can be switched from off to on. With the second drive line being connected to the positive electrode of the uppermost-stage energy storage device, the drive voltage of the FET is easily ensured. That is, even when the cell voltage of each energy storage device is low, since the voltage of the positive electrode of the uppermost-stage energy storage device is the sum of the cell voltages, the drive voltage of the FET is easily ensured.

In the energy storage device in the predetermined-number stage, the highest voltage of the positive electrode may be higher than an allowable value of the measurement unit, and the lowest voltage of the positive electrode may be lower than a threshold voltage of the FET. When the positive electrode of the energy storage device has the highest voltage, an overvoltage becomes a problem, and when the positive electrode of the energy storage device has the lowest voltage, the malfunction of the FET becomes a problem. However, by applying the present technology, both problems can be solved.

First Embodiment

1. Description of Structure of Battery 50

Figure 4:
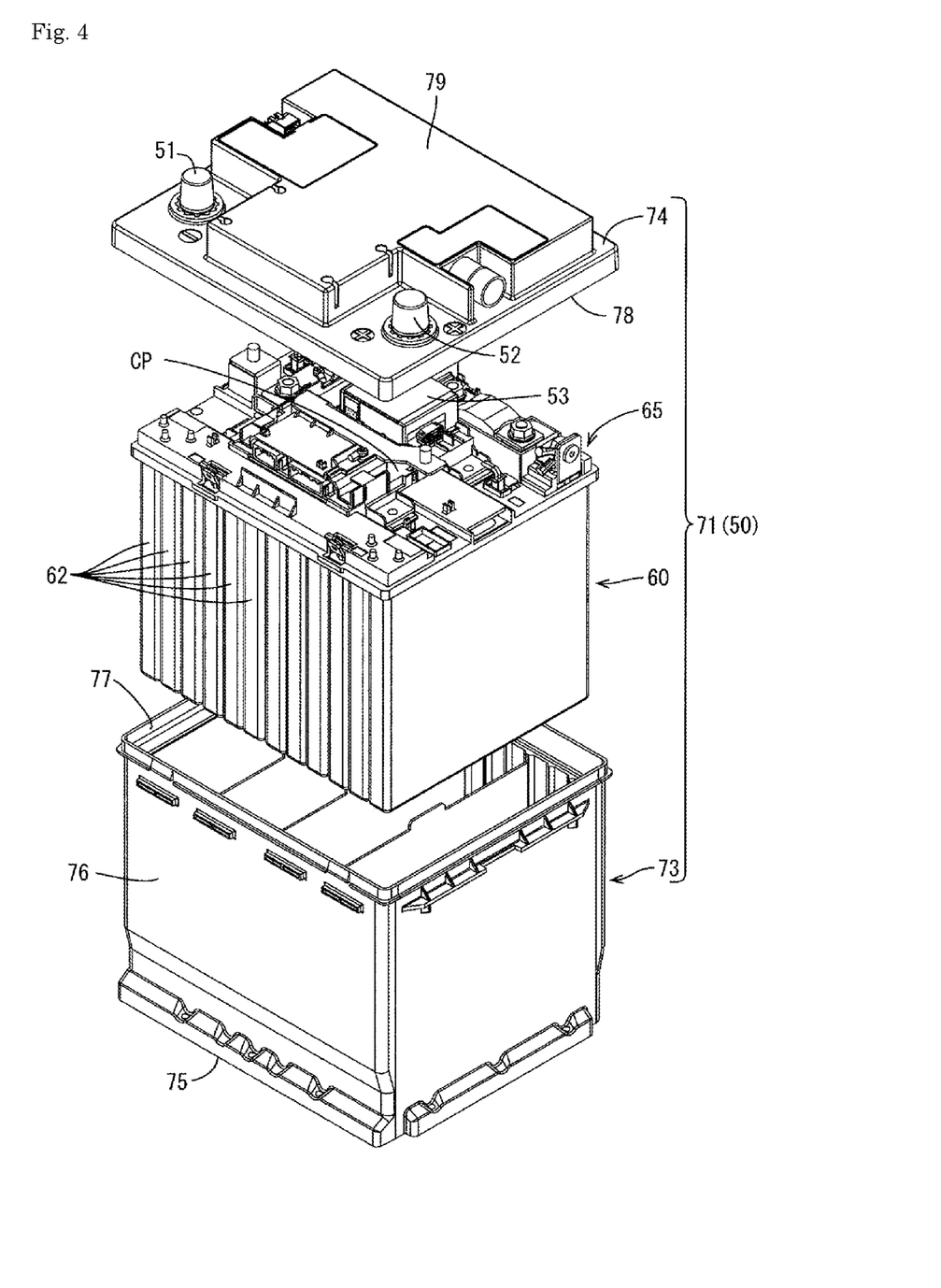
FIG. 4 is an exploded perspective view of a battery.

As illustrated in FIG. 4, a battery 50 includes an assembled battery 60, a control board 65, and a container 71.

The container 71 includes a body 73 made of a synthetic resin material and a lid body 74. The body 73 has a bottomed cylindrical shape. The body 73 includes a bottom surface portion 75 and four side surface portions 76. An upper opening 77 is formed in an upper-end portion by the four side surface portions 76.

The container 71 houses the assembled battery 60 and the control board 65. The assembled battery 60 has twelve secondary batteries 62. The twelve secondary batteries 62 are connected with three in parallel and four in series. The control board 65 includes a circuit board CP and an electronic component mounted on the circuit board CP and is disposed on the assembled battery 60.

The lid body 74 closes the upper opening 77 of the body 73. An outer peripheral wall 78 is provided around the lid body 74. The lid body 74 has a protrusion 79 in a substantially T-shape in a plan view. A first external terminal 51 of the positive electrode is fixed to one corner of the front portion of the lid body 74, and a second external terminal 52 of the negative electrode is fixed to the other corner.

Figure 5:
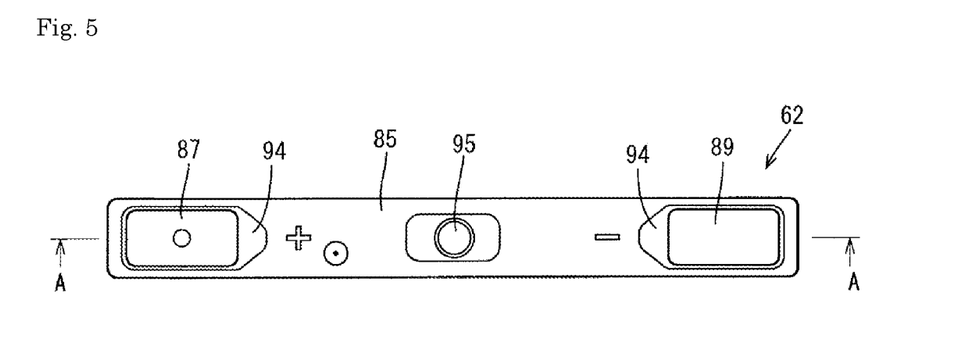
FIG. 5 is a plan view of a secondary battery.
Figure 6:
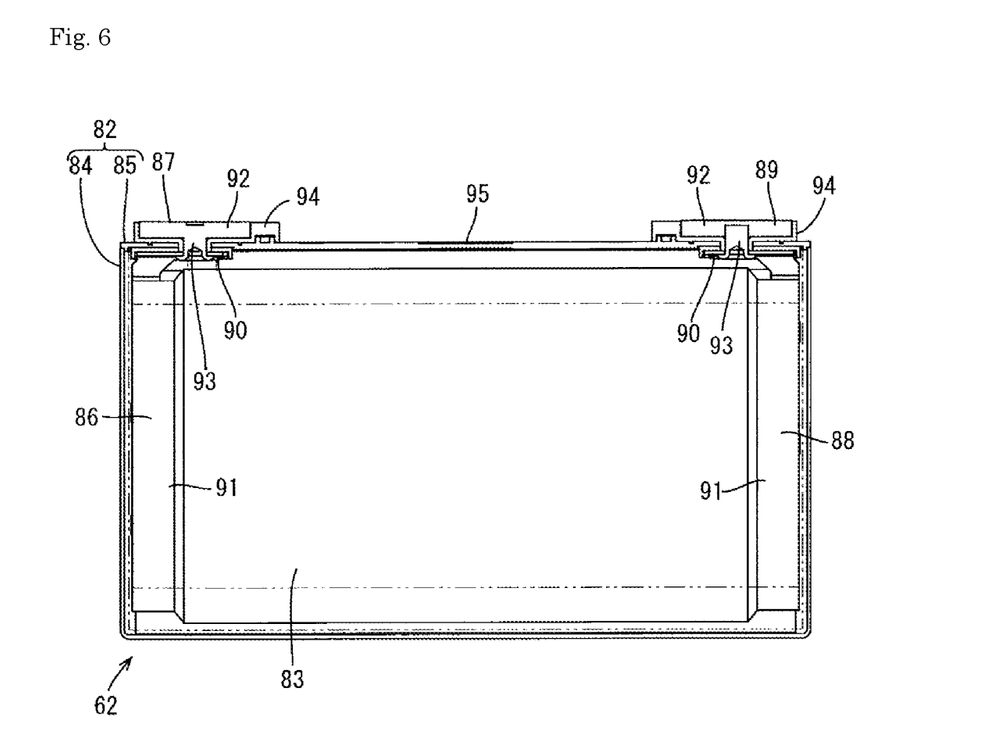
FIG. 6 is a cross-sectional view taken along line A-A in FIG. 5.

As illustrated in FIGS. 5 and 6, the secondary battery 62 houses an electrode assembly 83 together with a nonaqueous electrolyte in a case 82 having a rectangular parallelepiped shape. The secondary battery 62 is, for example, a lithium ion secondary battery. The case 82 has a case body 84 and a lid 85 for closing an opening at the top of the case body 84.

Although not shown in detail, the electrode assembly 83 has a separator made of a porous resin film and disposed between a negative electrode element formed by applying an active material to a substrate made of copper foil and a positive electrode element formed by applying an active material to a substrate made of aluminum foil. These are all belt-shaped, and are wound in a flat shape so as to be able to be housed in the case body 84 in a state where the negative electrode element and the positive electrode element are displaced from each other on the opposite sides in the width direction with respect to the separator.

A positive electrode terminal 87 is connected to the positive electrode element via a positive current collector 86, and a negative electrode terminal 89 is connected to the negative electrode element via a negative current collector 88. Each of the positive current collector 86 and the negative current collector 88 is made up of a plate-shaped base 90 and legs 91 extending from the base 90. A through hole is formed in the base 90. The leg 91 is connected to the positive electrode element or the negative electrode element. Each of the positive electrode terminal 87 and the negative electrode terminal 89 is made up of a terminal body portion 92 and a shaft 93 protruding downward from the center portion of the lower surface of the terminal body portion 92. Among those, the terminal body portion 92 and the shaft 93 of the positive electrode terminal 87 are integrally formed of aluminum (single material). The negative electrode terminal 89 has the terminal body portion 92 made of aluminum and the shaft 93 made of copper and is assembled with these. The terminal body portions 92 of the positive electrode terminal 87 and the negative electrode terminal 89 are disposed at both ends of the lid 85 via gaskets 94 made of an insulating material and are exposed outward from the gaskets 94.

The lid 85 has a pressure release valve 95. As illustrated in FIG. 5, the pressure release valve 95 is located between the positive electrode terminal 87 and the negative electrode terminal 89. The pressure release valve 95 is opened when the internal pressure of the case 82 exceeds a limit value to lower the internal pressure of the case 82.

Figure 7:
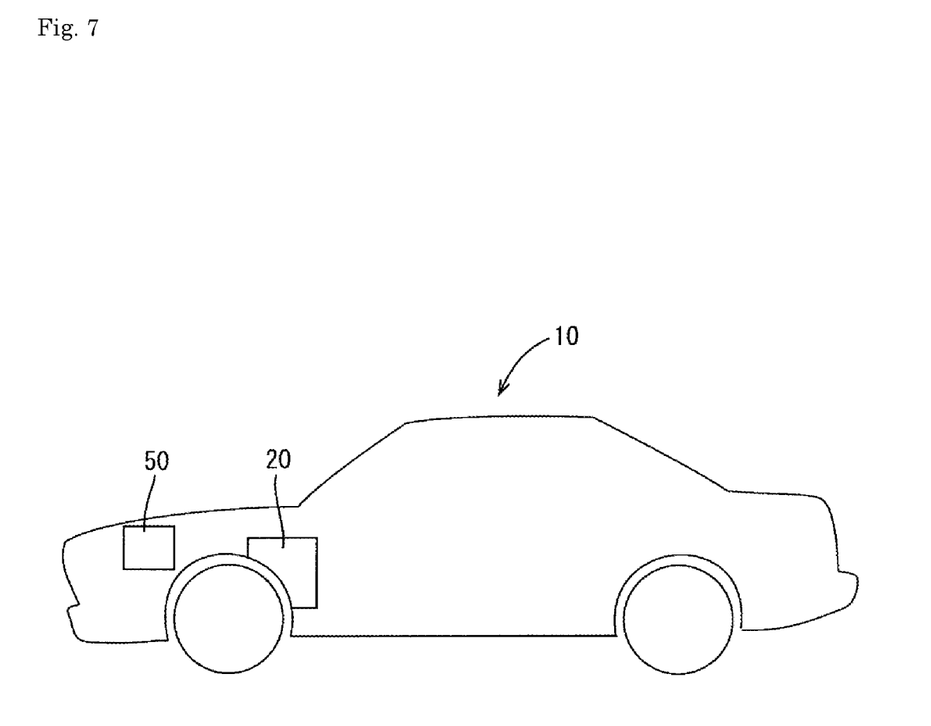
FIG. 7 is a side view of the automobile.

As illustrated in FIG. 7, the battery 50 can be used by being mounted on an automobile 10. The battery 50 may be used for starting an engine 20 that is a driving apparatus of the automobile 10.

2. Electrical Configuration of Battery 50

Figure 8:
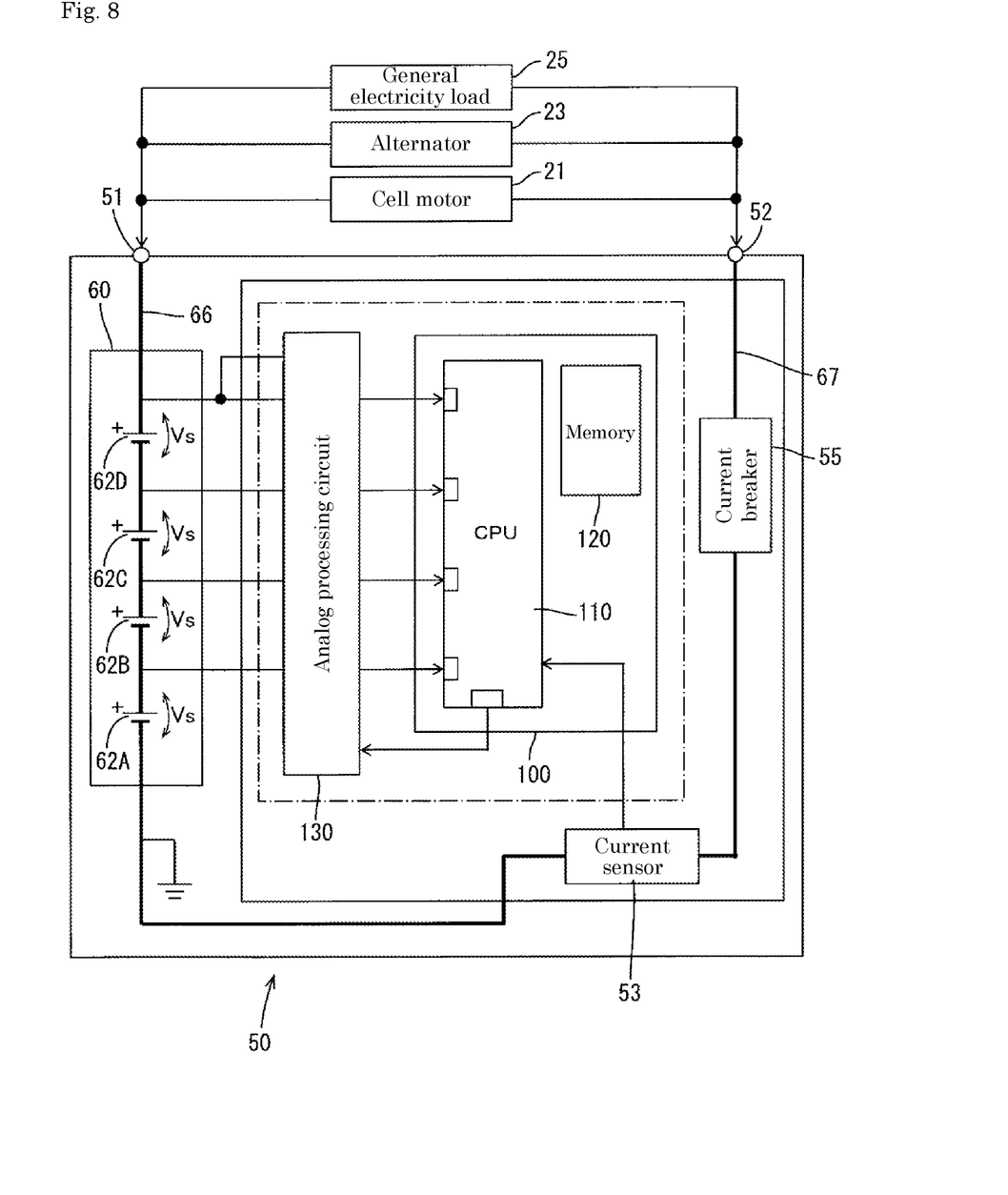
FIG. 8 is a block diagram of a battery.

FIG. 8 is a block diagram of the battery 50. The battery 50 is an "energy storage apparatus". The battery 50 includes the assembled battery 60, a current sensor 53, a current breaker 55, an analog processing circuit 130, a management unit 100, and a temperature sensor (not illustrated) that detects the temperature of the assembled battery 60.

The assembled battery 60 includes four secondary batteries 62A, 62B, 62C, 62D connected in series. The secondary battery 62 is an "energy storage device". The battery 50 is rated at 12 V.

The assembled battery 60, the current sensor 53, and the current breaker 55 are connected in series via a power line 66 and a power line 67. The power line 66 and the power line 67 are examples of a current path.

A power line 66 is a power line for connecting the first external terminal 51 and the positive electrode of the assembled battery 60. A power line 67 is a power line for connecting the second external terminal 52 to the negative electrode of the assembled battery 60.

The current sensor 53 is provided in the power line 67 of the negative electrode of the assembled battery 60. The current sensor 53 can measure a current I of the assembled battery 60.

The current breaker 55 is provided in the power line 67 of the negative electrode of the assembled battery 60. A field-effect transistor (FET) can be used as the current breaker 55. The current breaker 55 is controlled so as to be closed in a normal state. The battery 50 can be protected by being opened in an abnormal state.

The analog processing circuit 130 divides the voltage of the positive electrode of the first-stage secondary battery 62A, the voltage of the positive electrode of the second-stage secondary battery 62B, the voltage of the positive electrode of the third-stage secondary battery 62C, and the voltage of the positive electrode of the fourth-stage secondary battery 62D, and outputs the divided voltages to the management unit 100. The reason for lowering the voltage by the voltage division is to prevent the voltage from exceeding the allowable voltage of the CPU 110.

The management unit 100 includes a CPU 110 and a memory 120. The CPU 110 is a measurement unit that measures the voltage of the secondary battery 62 and has four input ports 111A to 111D for voltage measurement. The allowable voltage of the input port 111 is 5 V.

The management unit 100 performs monitoring processing for the battery 50 based on the outputs of the analog processing circuit 130, the current sensor 53, and the temperature sensor. The monitoring processing of the battery 50 may be the processing of monitoring an abnormality of the current I of the battery 50, an abnormality of the cell voltage Vs of each secondary battery 62, and an abnormality of the temperature of the battery 50.

Figure 9:
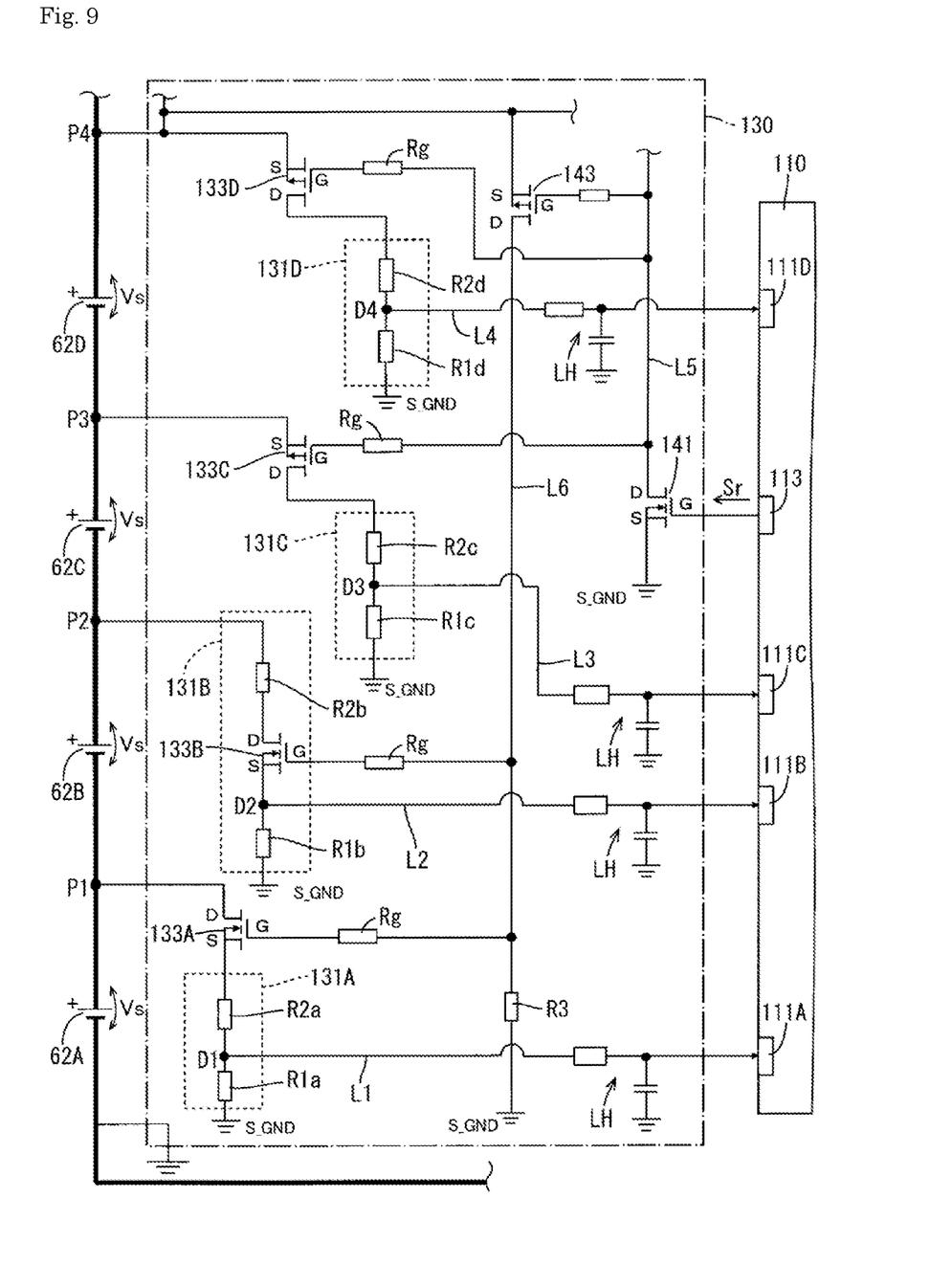
FIG. 9 is a circuit diagram of an analog processing circuit.

As illustrated in FIG. 8, a cell motor 21, which is an engine starter, an alternator 23, which is a vehicle generator, and a general electricity load 25 are connected to the battery 50. The general electricity load 25 is rated at 12 V and can be exemplified by a vehicle electronic control unit (ECU) mounted on the vehicle 10, an air conditioner, an audio system, a car navigation system, auxiliary equipment, and the like 3. Analog Processing Circuit FIG. 9 is a circuit diagram of the analog processing circuit 130. The analog processing circuit 130 includes a first voltage dividing circuit 131A, a first FET 133A, a second voltage dividing circuit 131B, a second FET 133B, a third voltage dividing circuit 131C, a third FET 133C, a fourth voltage dividing circuit 131D, a fourth FET 133D, a first drive line L5, and a second drive line L6. The FET is a field-effect transistor.

The first voltage dividing circuit 131A is a circuit that divides the voltage of the positive electrode (the voltage of P1) of the first-stage secondary battery 62A having the lowest potential. The first voltage dividing circuit 131A is made up of a first resistor R1$a$ and a second resistor R2$a$, and a connection point D1 of the two resistors is connected to a first input port 111A of the CPU 110 via a signal line L1. LH is a low-pass filter.

The first FET 133A is an N-channel and is located on the high side of the first voltage dividing circuit 131A. The first FET 133A has a source connected to the first voltage dividing circuit 131A and a drain connected to the positive electrode of the first-stage secondary battery 62A. The gate of the first FET 133A is connected to the second drive line L6 via a gate resistor Rg.

The second voltage dividing circuit 131B is a circuit that divides the voltage of the positive electrode (the voltage of P2) of the second-stage secondary battery 62B. The second voltage dividing circuit 131B is made up of a first resistor R1$b$ and a second resistor R2$b$, and a connection point D2 of the two resistors is connected to a second input port 111B of the CPU 110 via a signal line L2. LH is a low-pass filter.

The second FET 133B is an N-channel and is located between the first resistor R1$b$ and the second resistor R2$b$. The second FET 133B has a source connected to the first resistor R1$b$ and a drain connected to the second resistor R2$b$. The gate of the second FET 133B is connected to the second drive line L6 via a gate resistor Rg.

The third voltage dividing circuit 131C is a circuit that divides the voltage of the positive electrode (the voltage of P3) of the third-stage secondary battery 62C. The third voltage dividing circuit 131C is made up of a first resistor R1$c$ and a second resistor R2$c$, and a connection point D3 of the two resistors is connected to a third input port 111C of the CPU 110 via a signal line L3. LH is a low-pass filter.

The third FET 133C is a P channel and is located on the high side of the third voltage dividing circuit 131C. The third FET 133C has a source connected to the positive electrode (P3) of the third-stage secondary battery 62C and a drain connected to the third voltage dividing circuit 131C. The gate of the third FET 133C is connected to the first drive line L5 via a gate resistor Rg.

The fourth voltage dividing circuit 131D is a circuit that divides the voltage of the positive electrode (the voltage of P4) of the fourth-stage secondary battery 62D having the highest potential. The fourth voltage dividing circuit 131D is made up of a first resistor R1d and a second resistor R2d, and a connection point D4 of the two resistors is connected to a fourth input port 111D of the CPU 110 via a signal line L4. LH is a low-pass filter.

The fourth FET 133D is a P channel and is located on the high side of the fourth voltage dividing circuit 131D. The fourth FET 133D has a source connected to the positive electrode (P4) of the fourth-stage secondary battery 62D and a drain connected to the fourth voltage dividing circuit 131D. The gate of the fourth FET 133D is connected to the first drive line L5 via a gate resistor Rg.

The analog processing circuit 130 includes a first switch 141 and a second switch 143. The first switch 141 is an N-channel FET. The first switch 141 has a source connected to the ground and a drain connected to the first drive line L5. The gate of the first switch 141 is connected to an output port 113 of the CPU 110. When the first switch 141 is off, the first drive line L5 may be electrically connected to a predetermined high potential. The predetermined high potential may be the positive electrode (P4) of the fourth-stage secondary battery 62D.

The second switch 143 is a P-channel FET. The second switch 143 has a source connected to the positive electrode (P4) of the uppermost-stage (fourth-stage) secondary battery 62D and a drain connected to the second drive line L6. The second drive line L6 is connected to the ground via the resistor R3.

When an H-level measurement command Sr is output from the output port 113 of the CPU 110, the first switch 141 is turned on.

When the first switch 141 is turned on, the first drive line L5 is electrically connected to the ground. When the first drive line L5 is electrically connected to the ground, the gates of the third FET 133C and the fourth FET 133D each go to the low level, so that the third FET 133C and the fourth FET 133D are switched from off to on.

By the switching of the third FET 133C to on, a voltage obtained by dividing the voltage of the positive electrode (the voltage of P3) of the third-stage secondary battery 62C by the third voltage dividing circuit 131C is input to the third input port 111C of the CPU 110.

By the switching of the fourth FET 133D to on, a voltage obtained by dividing the voltage of the positive electrode (the voltage of P4) of the fourth-stage secondary battery 62D by the fourth voltage dividing circuit 131D is input to the fourth input port 111D of the CPU 110.

When the first switch 141 is turned on, the second switch 143 is turned on, and the second drive line L6 is electrically connected to the positive electrode of the fourth-stage secondary battery 62D. When the second drive line L6 is electrically connected to the positive electrode of the fourth-stage secondary battery 62D, the gates of the first FET 133A and the second FET 133B each go to the high level, so that the first FET 133A and the second FET 133B are switched from off to on.

By the switching of the first FET 133A to on, a voltage obtained by dividing the voltage of the positive electrode (the voltage of P1) of the first-stage secondary battery 62A by the first voltage dividing circuit 131A is input to the first input port 111A of the CPU 110.

By the switching of the second FET 133B to on, a voltage obtained by dividing the voltage of the positive electrode (the voltage of P2) of the second-stage secondary battery 62B by the second voltage dividing circuit 131B is input to the second input port 111B of the CPU 110.

In this manner, when the measurement command Sr is output, the voltages, obtained by dividing the voltages of the positive electrodes of the secondary battery 62A, the secondary battery 62B, the secondary battery 62C, and the fourth-stage secondary battery 62D by the first voltage dividing circuit 131A, the second voltage dividing circuit 131B, the third voltage dividing circuit 131C, and the fourth voltage dividing circuit 131D, are input to the four input ports 111A, 111B, 111C, 111D of the CPU 110.

Therefore, the CPU 110 can obtain the cell voltages Vs of the secondary battery 62A, the secondary battery 62B, the secondary battery 62C, and the secondary battery 62D from the input voltages of the first input port 111A, the second input port 111B, the third input port 111C, and the fourth input port 111D.

That is, the cell voltage Vs of the second-stage secondary battery 62B can be obtained by subtracting the voltage of the positive electrode of the first-stage secondary battery 62A from the voltage of the positive electrode of the second-stage secondary battery 62B. Similarly, the cell voltage Vs of the third-stage secondary battery 62C can be obtained by subtracting the voltage of the positive electrode of the second-stage secondary battery 62B from the voltage of the positive electrode of the third-stage secondary battery 62C. The cell voltage Vs of the fourth-stage secondary battery 62D can be obtained by subtracting the voltage of the positive electrode of the third-stage secondary battery 62C from the voltage of the positive electrode of the fourth-stage secondary battery 62D.

4. Description of Effects

When the highest voltage of the positive electrode of the secondary battery 62 is higher than the allowable voltage (V=5 V) of the CPU 110, and the lowest voltage of the positive electrode is lower than the threshold voltage (Vth=2.5 V) of the FET 133, both the problem of an overvoltage and the problem of malfunction of the FET cannot be solved even when the FET 133 is disposed on either the low side or the high side of the voltage dividing circuit 131.

For example, when the use range (cell voltage Vs) of each of the secondary batteries 62A to 62D is 1.2 V to 3.8 V, the lowest voltage of the positive electrode of the second-stage secondary battery 62B is 2.4 V, the highest voltage of the positive electrode is 7.6 V, the highest voltage of the positive electrode is higher than the allowable voltage (5 V) of the CPU 110, and the lowest voltage of the positive electrode is lower than the threshold voltage (Vth=2.5 V) of the FET 133.

In the analog processing circuit 130, an N-channel FET is used as the second FET 133B corresponding to the second-stage secondary battery 62B. The second FET 133B is located between the first resistor R1b and the second resistor R2b, and the source is a voltage output terminal to the CPU 110.

Since the second FET 133B is an N-channel and operates based on the ground, the switching can be performed without depending on the voltage of the positive electrode of the second-stage secondary battery 62B. Hence the malfunction of the second FET 133B can be prevented.

When the second FET 133B is turned off, the second input port 111B of the CPU 110 is electrically connected to the ground via the first resistor R1b and is not electrically connected to the positive electrode of the second-stage secondary battery 62B. Therefore, when the measurement is not performed, an overvoltage exceeding the allowable voltage is not input to the second input port 111B of the CPU 110.

As described above, both the problem of an overvoltage to the CPU 110 and the problem of malfunction of the second FET 133B can be solved for the second-stage secondary battery 62B.

The third-stage third FET 133C is a P-channel FET located on the high side of the third voltage dividing circuit 131C, and the fourth-stage fourth FET 133D is a P-channel FET located on the high side of the fourth voltage dividing circuit 131D.

When the third FET 133C is turned off, the third input port 111C of the CPU 110 is not electrically connected to the positive electrode of the third-stage secondary battery 62C, and when the fourth FET 133D is turned off, the fourth input port 111D of the CPU 110 is not electrically connected to the positive electrode of the fourth-stage secondary battery 62D. It is thus possible to prevent the occurrence of an overvoltage at each of the third input port 111C that measures the voltage of the third-stage secondary battery 62C and the fourth input port 111D that measures the voltage of the fourth-stage secondary battery 62C when the measurement is not performed.

The first-stage first FET 133A is an N-channel FET located on the high side of the first voltage dividing circuit 131A. The source of the first FET 133A is connected to the ground via the first voltage dividing circuit 131A. Since the first FET 133A operates based on the ground, the switching can be performed without depending on the voltage of the positive electrode of the first-stage secondary battery 62a. Hence the malfunction of the first FET 133A can be prevented.

Other Embodiments

The present invention is not limited to the embodiment explained by the above description and drawings, and for example, the following embodiments are also included in the technical scope of the present invention.

(1) In the above first embodiment, the secondary battery 62 has been exemplified as an example of the energy storage device. The energy storage device is not restricted to the secondary battery 62 but may be a capacitor. The secondary battery 62 is not limited to a lithium ion secondary battery but may be another nonaqueous electrolyte secondary battery. A lead-acid battery or the like can also be used.

(2) In the first embodiment, the battery 50 has been mounted on the automobile 10. The battery 50 may be mounted on a motorcycle. The battery 50 may be used for purposes other than engine starting. The battery 50 may be used for various uses such as a use for a moving body (a vehicle, a ship, an automatic guided vehicle (AGV), etc.) and an industrial use (an energy storage apparatus for an uninterruptible power supply system or a photovoltaic power generating system).

(3) In the first embodiment described above, the CPU 110 has been provided with the four input ports 111A, 111B, 111C, and 111D for voltage measurement. The number of the input ports 111 may be one. In this case, the connection destination of the input port 111 may be switched among the voltage dividing circuits 131A to 131D in the respective stages by using a multiplexer or the like.

(4) In the first embodiment described above, among the four FETs 133A, 133B, 133C, 133D in the first to fourth stages, the second-stage second FET 133B has been set as the N channel and disposed at the position between the first resistor R1b and the second resistor R2b of the second voltage dividing circuit 131B. The FET is not limited to the second-stage FET, but an FET in a predetermined-number stage may be set as N channels and disposed at positions between the first resistor R1 and the second resistor R2 of the voltage dividing circuit 131. For example, the problem of an overvoltage is likely to occur in a measurement line that measures a secondary battery having a high-number stage, and the problem of malfunction of the FET is likely to occur in a measurement line that measures a secondary battery having a low-number stage. That is, the problem of an overvoltage and the problem of malfunction of the FET are likely to occur in the measurement line that measures the secondary battery in the middle stage. Therefore, regardless of the relationship between the voltage of the positive electrode of the secondary battery and the allowable voltage of the CPU or the relationship between the voltage of the positive electrode of the secondary battery and the threshold voltage of the FET, the FET in the middle stage, such as the second stage and the third stage, may be set as an N channel and may be disposed at a position between the first resistor R1 and the second resistor R2 of the voltage dividing circuit 131. Even in a case where, as in the first stage, the fourth stage, or the like, the highest voltage of the positive electrode is higher than the allowable voltage of the CPU 110 or the lowest voltage of the positive electrode is lower than the threshold voltage of the FET 133, the FET 133 may be disposed between the first resistor R1 and the second resistor R2 of the voltage dividing circuit 131 as the N channel.

(5) In the first embodiment described above, the voltage measurement circuit for the assembled battery 60 has been described. The voltage measurement circuit may be a voltage measurement circuit for a single cell. That is, even in the case of the single cell, the same problems occur when the highest voltage of the positive electrode is higher than the allowable voltage of the measurement unit and the lowest voltage of the positive electrode is lower than the threshold voltage Vth of the FET.

DESCRIPTION OF REFERENCE SIGNS

10: automobile
50: battery (energy storage apparatus)
62: secondary battery (energy storage device)
100: management unit
110: CPU (measurement unit)
130: analog processing circuit
131A to 131D: first voltage dividing circuit to fourth voltage dividing circuit
133A to 133D: first FET to fourth FET
141: first switch
143: second switch
L5: first drive line
L6: second drive line

The invention claimed is:

1. A voltage measurement circuit comprising:
voltage dividing circuits that divide voltages of energy storage devices in respective stages connected in series;
switches that cut off currents of the voltage dividing circuits in the respective stages; and
a measurement unit that measures a voltage of each of the energy storage devices in the respective stages based on an output of each of the voltage dividing circuits in the respective stages,
wherein
the voltage dividing circuit in each of the stages includes a first resistor connected to a ground and a second resistor connected to a positive electrode of the corresponding energy storage device, the switch in a predetermined-number stage among the switches in the respective stages is an N-channel field-effect transistor (FET) having a source connected to the first resistor and a drain connected to the second resistor, and the source of the FET is a voltage output terminal with respect to the measurement unit, and the switch in a stage, which is a higher stage than the predetermined-number stage where the source of the N-channel FET is connected to the first resistor, is a P-channel FET located on a high side of the voltage dividing circuit.

2. The voltage measurement circuit according to claim 1, wherein the switch in a stage, which is a lower stage than the predetermined-number stage where the source of the N-channel FET is connected to the first resistor, is an N-channel FET having a source connected to the ground.

3. The voltage measurement circuit according to claim 2, further comprising:
a first drive line that drives the P-channel FET; and
a second drive line that drives the N-channel FET whose source is connected to the first resistor and the N-channel FET whose source is connected to the ground,
wherein
the first drive line is connected to the ground via a first switch, and
the second drive line is connected to a positive electrode of an energy storage device in an uppermost stage via a second switch.

4. An energy storage apparatus comprising:
one energy storage device or a plurality of energy storage devices connected in series; and
the voltage measurement circuit according to claim 1.

5. A voltage measurement circuit comprising:
voltage dividing circuits that divide voltages of energy storage devices in respective stages connected in series;
switches that cut off currents of the voltage dividing circuits in the respective stages; and
a measurement unit that measures a voltage of each of the energy storage devices in the respective stages based on an output of each of the voltage dividing circuits in the respective stages,
wherein
the voltage dividing circuit in each of the stages includes a first resistor connected to a ground and a second resistor connected to a positive electrode of the corresponding energy storage device,
the switch in a predetermined-number stage among the switches in the respective stages is an N-channel field-effect transistor (FET) having a source connected to the first resistor and a drain connected to the second resistor, and the source of the FET is a voltage output terminal with respect to the measurement unit, and
in the energy storage device in the predetermined-number stage, a highest voltage of the positive electrode is higher than an allowable value of the measurement unit, and a lowest voltage of the positive electrode is lower than a threshold voltage of the FET.

6. A voltage measurement circuit comprising:
a voltage dividing circuit that divides a voltage of an energy storage device;
a switch that cuts off a current of the voltage dividing circuit; and
a measurement unit that measures the voltage of the energy storage device based on an output of the voltage dividing circuit,
wherein
the voltage dividing circuit includes a first resistor connected to a ground and a second resistor connected to a positive electrode of the energy storage device,
the switch is an N-channel field-effect transistor (FET) having a source connected to the first resistor and a drain connected to the second resistor, and the source of the FET is a voltage output terminal with respect to the measurement unit, and
a highest voltage of the positive electrode is higher than an allowable value of the measurement unit, and a lowest voltage of the positive electrode is lower than a threshold voltage of the FET.

* * * * *